(12) United States Patent
Kimura et al.

(10) Patent No.: US 6,928,596 B2
(45) Date of Patent: Aug. 9, 2005

(54) TEST CIRCUIT OF SEMICONDUCTOR INTEGRATED CIRCUIT

(75) Inventors: Tohru Kimura, Yokohama (JP); Toshiki Hisada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 522 days.

(21) Appl. No.: 09/948,406

(22) Filed: Sep. 6, 2001

(65) Prior Publication Data

US 2002/0032887 A1 Mar. 14, 2002

(30) Foreign Application Priority Data

Sep. 7, 2000 (JP) ........................................ 2000-271910

(51) Int. Cl.$^7$ .............................................. G11C 29/00
(52) U.S. Cl. .......................... 714/718; 714/724; 714/25; 365/51; 365/63
(58) Field of Search ................................ 714/718, 724, 714/24; 365/230.03, 51, 63; 257/E23.079, E23.085; 324/212, 765

(56) References Cited

U.S. PATENT DOCUMENTS

| | | | |
|---|---|---|---|
| 4,975,641 A | * 12/1990 | Tanaka et al. | ............ 324/763 |
| 5,110,754 A | 5/1992 | Lowrey et al. | |
| 5,341,383 A | * 8/1994 | Shikatani et al. | ........... 714/724 |
| 5,806,084 A | * 9/1998 | Lin et al. | .................... 711/110 |
| 5,914,968 A | 6/1999 | Keeth | |
| 5,943,285 A | * 8/1999 | Kohno | .................. 365/230.03 |
| 6,438,013 B2 | * 8/2002 | Wakasugi et al. | ............. 365/63 |
| 6,484,278 B1 | * 11/2002 | Merritt et al. | ............. 714/719 |

FOREIGN PATENT DOCUMENTS

| | | |
|---|---|---|
| JP | 6-201795 | 7/1994 |
| JP | 11-353900 | 12/1999 |
| JP | 2000-012699 | 1/2000 |
| JP | 2000-123592 | 4/2000 |
| JP | 2001-067893 | 3/2001 |

* cited by examiner

*Primary Examiner*—Guy J. Lamarre
*Assistant Examiner*—John P. Trimmings
(74) *Attorney, Agent, or Firm*—Hogan & Hartson, LLP

(57) ABSTRACT

A test code is input to a test mode control circuit so that the test mode control circuit creates the test decode signal. The test decode signal is converted into serial data with a parallel-serial converting circuit in synchronization with a base clock. The serial data is input to a serial-parallel converting circuit located in the vicinity of the test code latch circuit dispersed on the semiconductor chip via one very long serial data line extending from end to end of the semiconductor chip.

26 Claims, 9 Drawing Sheets

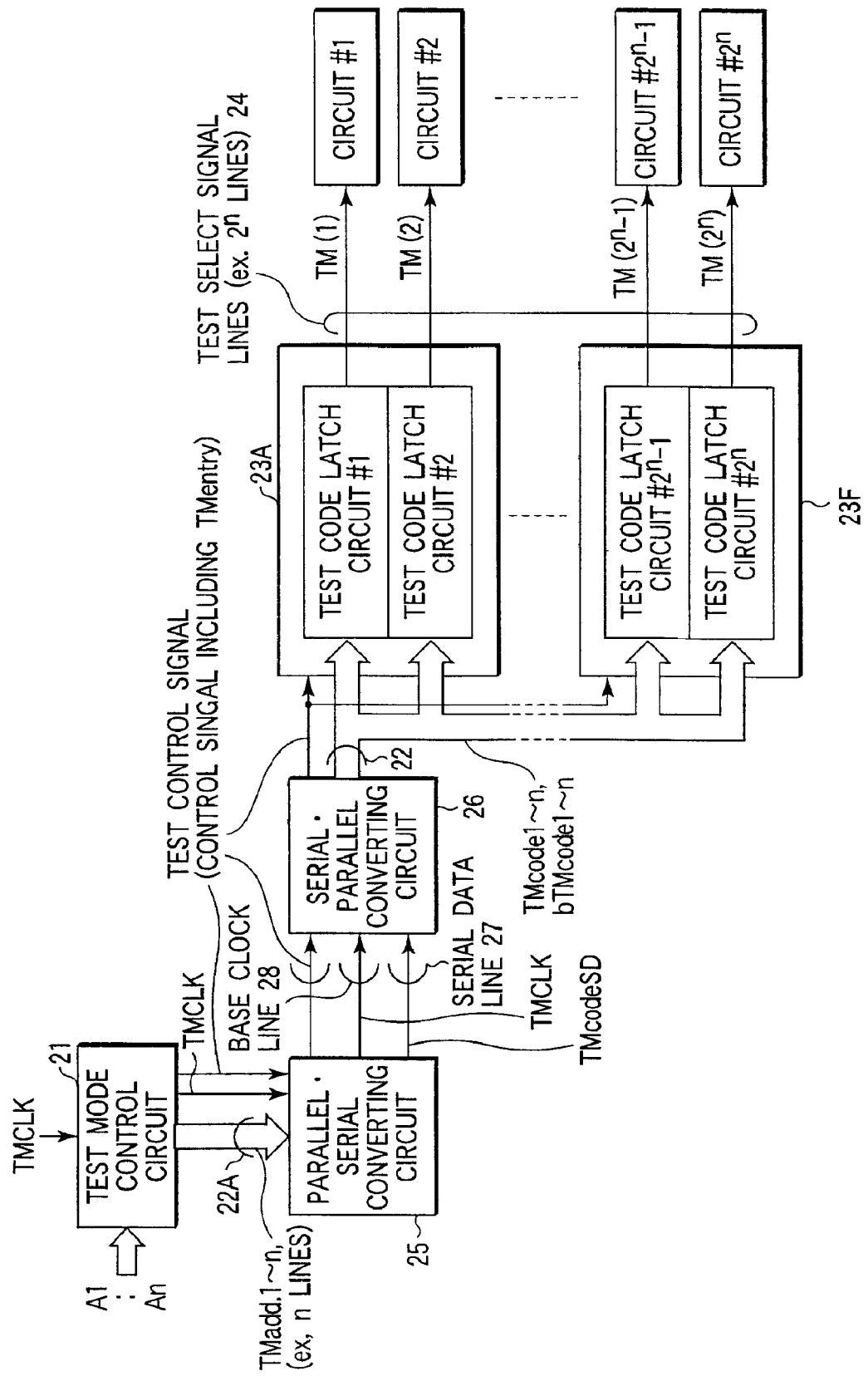
F I G. 6

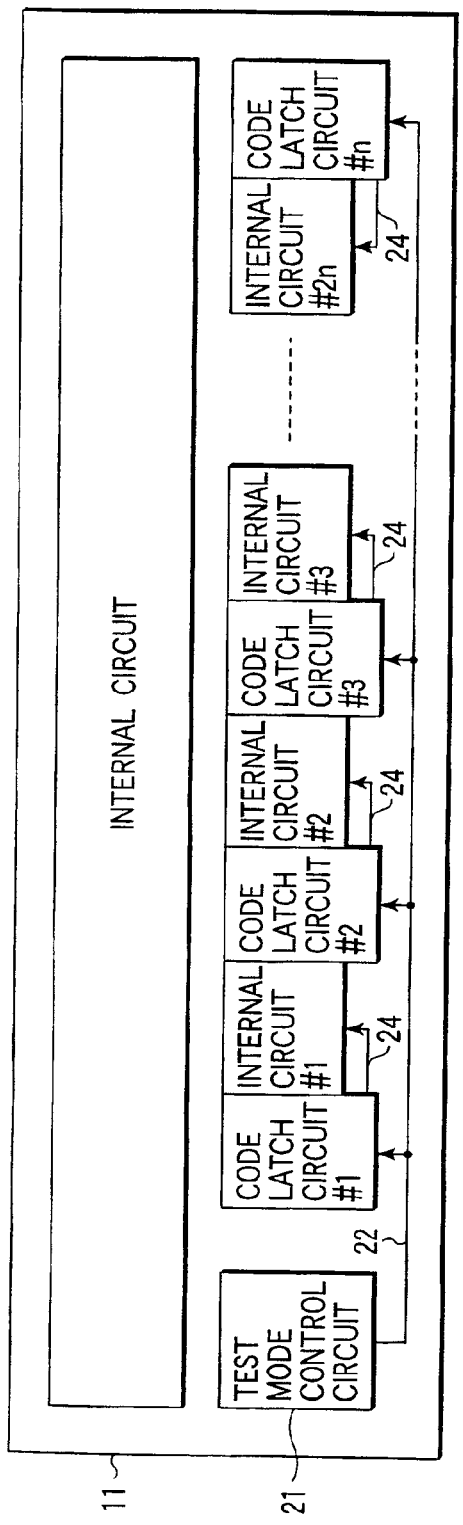
F I G. 9
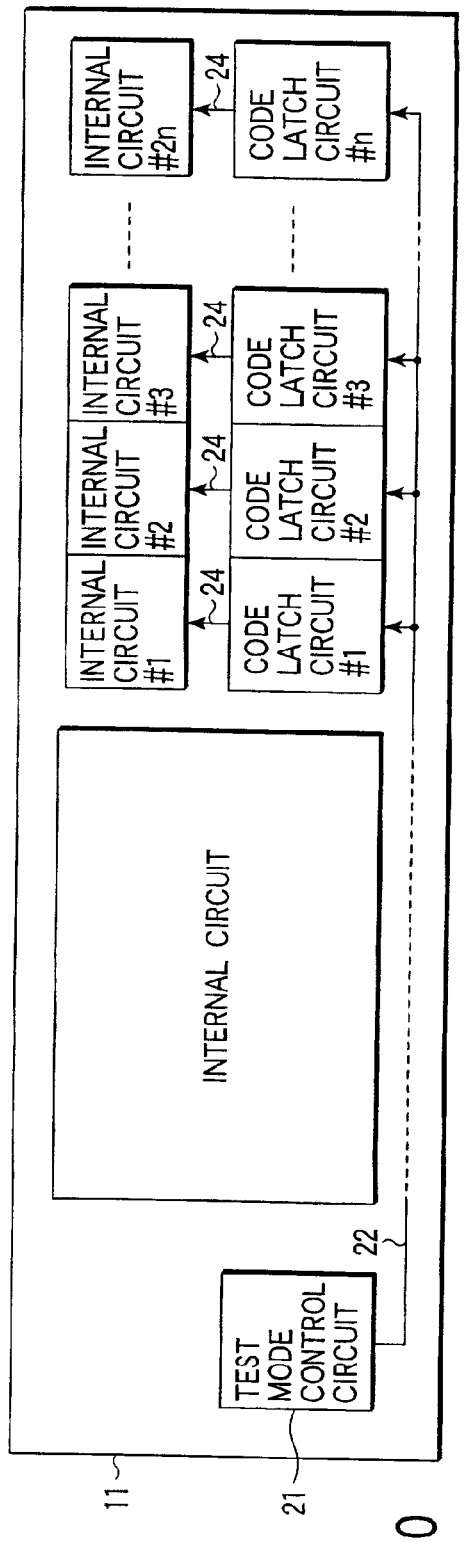
F I G. 10

TEST CIRCUIT OF SEMICONDUCTOR INTEGRATED CIRCUIT

CROSS-REFERENCE TO RELATED APPLICATIONS

This application is based upon and claims the benefit of priority from the prior Japanese Patent Application No. 2000-271910, filed Sep. 7, 2000, the entire contents of which are incorporated herein by reference.

BACKGROUND

The present invention relates to a test circuit of a semiconductor integrated circuit, in particular, to a semiconductor device in which a test circuit is incorporated in a semiconductor chip and a chip size affects the area (in particular, a wiring area) of the test circuit.

The integration degree of the device in a semiconductor integrated circuit has been improved more and more, and the semiconductor integrated circuit has also become more complicated along with such improvement. As a consequence, for example, test time for evaluating the validity of the semiconductor integrated circuit in the development of products has increased. On the other hand, in order to reduce the development cost of the semiconductor integrated circuit and realize a cost reduction of the product, it becomes necessary to improve the evaluation efficiency of the semiconductor integrated circuit and to decrease the test time of the development of products.

Recently, in the development of products, at the design stage, the circuit to be tested (the circuit the operation of which is worried, and the circuit with which a special operation is desired to be conducted) has a plurality of different characteristics (or operations) and the semiconductor integrated circuit is designed so that the plurality of these characteristics can be selected.

That is, when one circuit has a plurality of characteristics in advance, a plurality of characteristics can be tested with respect to one circuit only by manufacturing one semiconductor chip (semiconductor device), and the evaluation efficiency of the semiconductor integrated circuit is improved.

Specifically, a switching circuit which is capable of switching over the characteristics (or operations) of the circuit to be tested is arranged in the semiconductor chip, and the switching circuit is controlled with a test select signal. Furthermore, the test select signal is created with the test circuit. That is, a test mode entry signal for the entry into the test mode is input to the test circuit at a special timing which is different from the normal timing. Then, in the test circuit, since the test mode is recognized, the test decode signal is latched with the test code latch circuit so that the test select signal is created.

SUMMARY

A test circuit of a semiconductor integrated circuit according to an aspect of the present invention comprises: a test mode control circuit arranged in the vicinity of a pad for inputting a test code for judging on the basis of the test code whether or not the mode is a test mode, and outputting a test decode signal when the mode is the test mode; a plurality of test code latch circuits provided in correspondence to a plurality of internal circuits for latching a test decode signal while decoding the test decode signal to select one of the plurality of internal circuits, and outputting a test select signal for changing the characteristics of the internal circuit selected out of the plurality of internal circuits; a plurality of test decode lines for transmitting a plurality of test decode signals from the test mode control circuit to a plurality of test code latch circuits; and a plurality of test select signal lines for transmitting a test select signal line from a plurality of test code latch circuits to a plurality of internal circuits.

BRIEF DESCRIPTION OF THE DRAWING

FIG. 6 is a view showing one example of a test circuit in the semiconductor memory of FIG. 5.

FIG. 9 is a view showing a third example of a layout of the semiconductor memory as the embodiment of the present invention.

FIG. 10 is a view showing a fourth example of a layout of the semiconductor memory as the embodiment of the present invention.

DETAILED DESCRIPTION

A test circuit of a semiconductor integrated circuit according to an aspect of the present invention will be described below in detail with reference to the accompanying drawings.

1. REFERENCE EXAMPLE

In the beginning, one example of a test circuit of the semiconductor integrated circuit will be explained as a reference example of the present invention.

Figure 1:
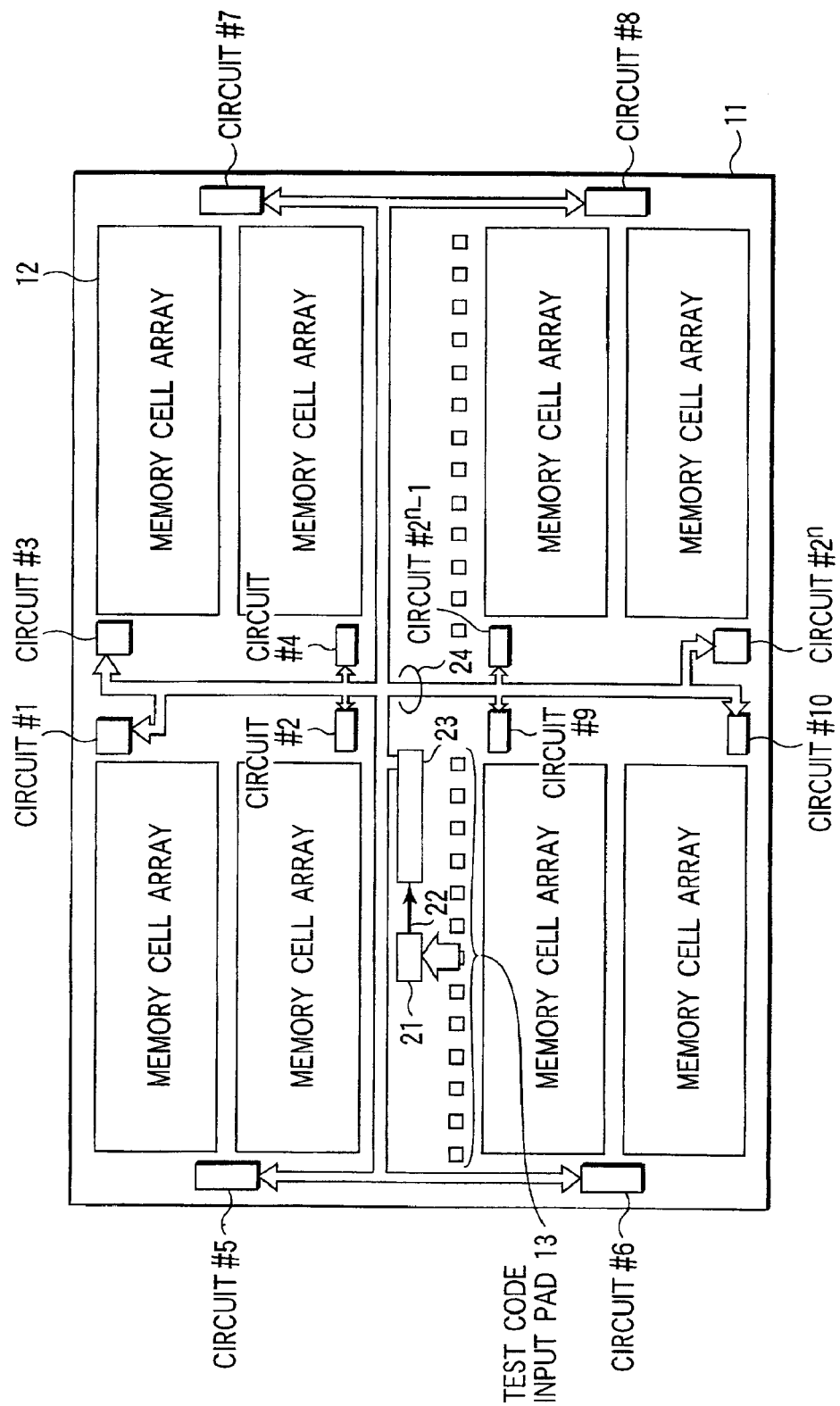
FIG. 1 is a view showing one example of a layout of a semiconductor memory as a reference example of the present invention.

FIG. 1 is view showing a layout (floor plan) on a semiconductor chip of the semiconductor memory which is one example of the semiconductor integrated circuit.

On a semiconductor chip 11, a plurality of memory cell arrays 12 are arranged. On the peripheral portion of each memory cell array 12, a peripheral circuit for controlling an operation of the semiconductor memory is arranged. In this example, as peripheral circuits, there are shown twelve internal circuits (circuit to be tested) #1, #2, #3, #4, . . . #$2^{n-1}$ and #$2^n$.

A pad 13 is arranged on the center portion of the semiconductor chip 11. The pad 13 has a function of inputting an address signal, a control signal, a reference signal or the like, for example, at the time of the normal operation, and a part of the pad 13 functions as a test code input pad for inputting a control signal including a test address signal a test mode entry signal at the time of the test.

The pad 13 is not arranged on the central portion of the semiconductor chip 11, but may be arranged on the fringe of the semiconductor chip 11.

In the vicinity of the test code input pad 13, a test mode control circuit 21 is arranged. The test mode control circuit 21 outputs a control signal (test control signal) including a test mode entry signal which is synchronized with the base clock after recognizing a test mode on the basis of the test address signal (key code) input to the semiconductor chip 11 from the test code input pad 13. Furthermore, after recognizing the test mode, the test mode control circuit 21 creates a test decode signal on the basis of the test address signal (test code) subsequently input into the semiconductor chip 11 from the test code input pad 13.

The test decode signal is input to a test code latch circuit 23 in synchronization with the test control signal via a test decode line 22. Furthermore, the control signal (test control signal) including the test entry signal is also input to the test code latch circuit. At the time of the test mode, the test decode signal is latched with the test code latch circuit 23. The test code latch circuit 23 decodes the test decode signal to create a test select signal.

The test select signal is input to the internal circuits #1, #2, #3, #4, . . . #$2^{n-1}$, #$2^n$ via the test select signal line 24. The characteristic (operation) of the internal circuits #1, #2, #3, #4, . . . #$2^{n-1}$, #$2^n$ is determined with this test select signal.

Figure 2:
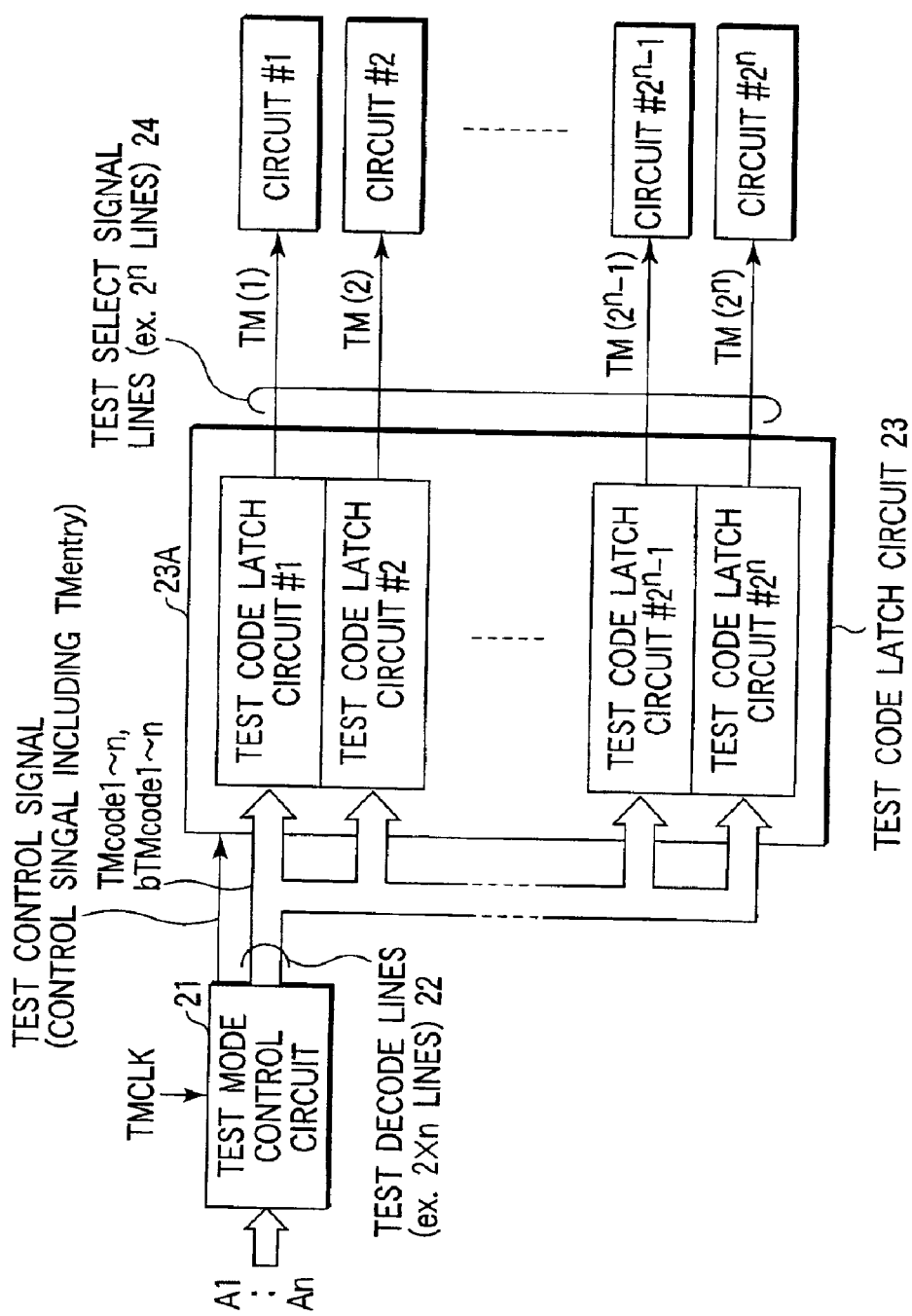
FIG. 2 is a view showing one example of a test circuit in the semiconductor memory of FIG. 1.

FIG. 2 is a view showing in detail a test circuit of the semiconductor integrated circuit of FIG. 1.

At the time of the test mode, a base clock TMCLK for controlling the operation of the test circuit is input to the semiconductor chip via a predetermined pad. For example, at the time of the normal operation, a pad for reference signal for inputting a definite potential at the time of normal operation can be used as a pad for inputting the base clock TMCLK at the time of the test mode.

In synchronization with the base clock (latch signal) TMCLK, test address signals A1, . . . An are input into the test mode control circuit 21. The test mode control circuit 21 recognizes whether or not the mode is the test mode on the basis of the test address signals A1, . . . An.

For example, in the case where the test address signals A1, . . . , An are input once or more (in the case where the test address signals are input twice or more, the value of n of the test address signals A1, . . . An may be changed for each input), the test mode is recognized with the test mode control circuit 21 in the case where a combination of the test address signals A1, . . . An (corresponding to Key 1 and Key 2 of FIG. 8) input at least once or more represents an entry of the test mode.

Then, subsequently, the test address signals A1, . . . An (corresponding to Code of FIG. 8) input into the semiconductor chip is taken into the test mode control circuit 21 as a test address (test code).

Thereafter, the test mode control circuit 21 creates a control signal including a test mode entry signal TMentry which is synchronized with the base clock TMCLK while creating the test decode signals TMcode 1 to n, and bTMcode 1 to n on the basis of the test address signals A1, . . . An (n is a natural number).

In this example, the test decode signals TMcode 1 to n and bTMcode 1 to n are transmitted from the test mode control circuit 21 to the test code latch circuit 21 with 2×n test decode lines 22. Incidentally, bTM code 1 to n are inverse signals of the TMcode 1 to n.

The test code latch circuit 21 latches the test decode signals TMcode 1 to n and bTMcode 1 to n in synchronization with a control signal including the test mode entry signal TMentry which is synchronized with the base clock TMCLK. The test code latch circuit 23 comprises $2^n$ test code latch circuits #1, #2, . . . #$2^n$-1, and #$2^n$ in correspondence of $2^n$ internal circuit #1, #2, . . . #$2^n$-1, #$2^n$ to be tested.

That is, $2^n$ internal circuits #1, #2, . . . #$2^n$-1 and #$2^n$ test code latch circuits #1, #2, . . . #$2^n$-1 and #$2^n$ correspond to each other on a one-to-one basis. Furthermore, $2^n$ internal circuits #1, #2, . . . #$2^n$-1 and #$2^n$ and $2^n$ test code latch circuits #1, #2, . . . #$2^n$-1 and #$2^n$ are connected through $2^n$ test select signal lines.

The test code latch circuits #1, #2, . . . #$2^n$-1 and #$2^n$ decodes the test decode signals TMcode 1 to n and bTMcode 1 to n. As a consequence, one of $2^n$ test decode latch circuits #1, #2, . . . #$2^n$-1 and #$2^n$ is selected, and an output signal (test select signal) of one selected test code latch circuit is set in an selected state (for example, "HH").

Besides, the output signal (test select signal) of the remaining $2^n$-1 test code latch circuits is set to a non-selected state (for example, "L").

Then, with respect to the internal circuit #i corresponding to the selected test code latch circuit #i (i is one of the 1 to $2^n$), the characteristic (or operation) thereof is changed with the test selections signal TM (i). Furthermore, the characteristic (or operation) of the internal circuit corresponding to the non-selected test code latch circuit is not changed.

Incidentally, in the case where the characteristics (or operation) of the plurality of internal circuits is changed, the above operation is repeatedly conducted.

By the way, the control signal including the test mode entry signal TMentry may be input to the test code latch circuit 23 with an original signal line. Furthermore, instead of this, the test decode signals TMcode 1 to n and bTMcode 1 to n may be input to the test decode latch circuit 23 by using the test decode line 22 before inputting the signals to the test code latch circuit 23.

Furthermore, in this example, the test decode signals are TMcode 1 to n and bTMcode 1 to n. Instead of this, bTMcode 1 to n are omitted, and test decode signal may be only TMcode 1 to n.

Furthermore, the value of n in the above test circuit is determined with the number of test items (corresponding to the total of the test code latch circuits #1, #2, . . . #$2^n$-1 and $2^n$). For example, when the number of test items is 256, n=8 is provided.

In the test circuit of the semiconductor integrated circuit as described above, the characteristic of the internal circuit formed in the semiconductor chip can be changed. Consequently, the evaluation efficiency of the internal circuits in the product development can be improved while the test time can be shortened with the result that the cost reduction of products can be realized with the reduction in the development cost.

When the functions of the semiconductor integrated circuits increases and the semiconductor integrated circuit becomes complicated, the number of test items (corresponding to the number of internal circuits which change in characteristic) in the product development also increases. When the number of test items increases, the scale of the test circuit increases. As a consequence, the area occupied by the test circuit in the semiconductor chip increases to a level on which the area cannot be ignored. In particular, the test select signal line for connecting the test code latch circuit and the internal circuits is required for the number of test items so that an increase in the number of test items promotes an increase in the chip area.

By the way, in the semiconductor integrated circuit having a test circuit, for the facilitation of the design, as shown in FIG. 1, the test mode control circuit 21 and the test code latch circuit 23 are arranged in the vicinity of the test code input pad 13 while the test code latch circuit 23 is substantially arranged at one location (such layout is referred to "a collected arrangement type").

In the case where such collected arrangement type layout is adopted, the test select signal line 24 for connecting the test code latch circuit 23 and the internal circuit (tested circuit) #1, #2, . . . #$2^n$–1 and $2^n$ arranged at various locations on the semiconductor chip 11 becomes very long. Consequently, when the number of test items increases, a layout area of the test select signal line 24 extremely increases and the chip size is increased.

Furthermore, the test select signals TM1, TM2, . . . TM($2^n$–1) and $2^n$ for directly determining whether or not the characteristic of the internal circuit is changed are guided from the test code latch circuit 23 to the internal circuits #1, #2, . . . #$2^n$–1 and #$2^n$ via a very long test select signal line 24.

As a consequence, at the time of test, a noise is generated in the test select signal 24 with the capacity coupling with the result that the characteristic of the non-selected internal circuit is changed or the characteristics of the selected internal circuit is not changed. Thus, the evaluation of the internal circuit itself becomes low in reliability. Furthermore, when a noise is generated in the test select signal line 24 resulting from the noise of the power source at the time of the normal operation, a situation can be considered in which the test circuit is erroneously operated.

Incidentally, FIG. 1 is a view showing a layout of the semiconductor memory. It goes without saying that a similar problem is generated in the semiconductor integrated circuit other than the semiconductor memory.

2. EMBODIMENT

2.-1 Summary

A test circuit of a semiconductor integrated circuit according to an aspect of the present invention comprises:

a test mode control circuit arranged in the vicinity of the pad for inputting a test code for judging on the basis of the test code whether or not the mode is a test mode and outputting a test decode signal when the mode is the test mode;

a plurality of test code latch circuits provided in correspondence to a plurality of internal circuits for latching the test decode signal, while decoding the test decode signal to select one of the plurality of internal circuits and outputting a test select signal for changing the characteristics of the selected internal circuit out of the plurality of internal circuits; and a plurality of test select signal lines for transmitting a test select signal from a plurality of test code latch circuits to a plurality of internal circuits.

The plurality of test code latch circuits are substantially dispersed and arranged on the semiconductor chip so that the length of the plurality of test select signal lines becomes shorter than a definite value while at least one of the plurality of test decode lines is arranged such that the length thereof becomes longer than the average length of the plurality of test select signal lines.

Incidentally, the average length of the test select signal line means that a case in which one or several signal lines (dummy test select signal lines) which have not been used for an actual test circuit and the internal circuit, and the case in which the signal lines is made very longer is included in the range of the right.

At least one of the plurality of test decode lines may be made longer than at least half of the plurality of test select signal lines. Furthermore, at least one of the plurality of test decode lines may be made longer than all the plurality of test select signal lines.

The test decode signal is n (n is a natural number) bits, and a plurality of test select signal lines are ($2^n$–1) or more, and $2^n$ or less. The number of the plurality of test code latch circuits and the number of the plurality of internal circuits are both ($2^n$–1) or more, and $2^n$ or less.

The plurality of test code latch circuits are not deviated to one part on the semiconductor chip, and are uniformly arranged on the semiconductor chip.

A test circuit of a semiconductor integrated circuit according to an aspect of the present invention comprises:

a test mode control circuit arranged in the vicinity of a pad for inputting a test code for judging on the basis of the test code whether or not the mode is a test mode and outputting a first test decode signal when the mode is the test mode;

a parallel-serial converting circuit arranged in the vicinity of the test mode control circuit for converting a first test decode signal into serial data in synchronization with a base clock;

a plurality of serial-parallel converting circuits for converting serial data into a second test decode signal in synchronization with the base clock;

a plurality of test code latch circuits provided in correspondence to the plurality of internal circuits for latching the second test decode signal while decoding the second decode signal to select one of the plurality of internal circuits and outputting a test select signal for changing the characteristics of the selected internal circuit out of the plurality of internal circuits;

a first test decode line for transmitting the first test decode signal from the test mode control circuit to the parallel-serial converting circuit;

a serial data line for transmitting the serial data from the parallel-serial converting circuit to a plurality of serial-parallel converting circuits;

a second test decode line for transmitting the second test decode signal from the plurality of serial-parallel converting circuit to the plurality of test code latch circuits;

a plurality of test select signal lines for transmitting the test select signal from the plurality of test code latch circuits to the plurality of internal circuits.

The plurality of test code latch circuits are substantially dispersed and arranged so that the length of the plurality of test select signal lines becomes shorter than the definite value while the plurality of serial-parallel converting circuits are arranged in the vicinity of the plurality of test code latch circuits and the serial data line is arranged so that the length thereof becomes longer than the average length of the plurality of test select signal lines.

Incidentally, the "average length of the test select signal lines" means that a case in which one or several signal lines (dummy test select signal lines) which have not been used for an actual test are arranged between the test code latch circuits and the internal circuits and the signal lines are made very longer is also included in the range of the right.

The serial data line may be made longer than at least half or more of the plurality of test select signal lines. Furthermore, the serial data line may be made longer than all the plurality of test select signal lines.

The first and second test decode signals are both n (n is a natural number) bits. The first test decode lines are n lines while the second test decode lines are 2×n. The plurality of test select signal lines are ($2^n$+1) or more, and $2^n$ or less. The number of the plurality of test code latch circuits and the number of the plurality of internal circuits are both ($2^n$+1) or more, and $2^n$ or less.

The serial data is transmitted to the serial-parallel converting circuit from the parallel-serial converting circuit in synchronization with the base clock. The base clock is supplied from the parallel-serial converting circuit to a plurality of serial-parallel converting circuit via the base clock line.

The plurality of test code latch circuits are not deviated to a portion on the semiconductor chip but are uniformly arranged on the semiconductor chip.

A test circuit of a semiconductor integrated circuit according to an aspect of the present invention comprises:

a test mode control circuit for judging on the basis of the test code whether or not the mode is a test mode and outputting a test decode signal when the mode is the test mode;

a plurality of test code latch circuits provided in correspondence to the plurality of internal circuits for latching the test decode signal while decoding the test decode signal to select one of the plurality of internal circuits and outputting a test select signal for changing the characteristics of the selected internal circuit out of the plurality of internal circuits;

a plurality of test decode lines for transmitting a test decode signal from the test mode control circuit to the plurality of test code latch circuits; and a plurality of test select signal lines for transmitting the test select signal from the plurality of test code latch circuits to the plurality of internal circuits.

The plurality of test code latch circuits are arranged in the vicinity of the plurality of internal circuits so that the length of the plurality of test select signal lines becomes shorter than the definite value while at least one of the plurality of test decode lines are set to be longer than the average length of the plurality of test select signal lines.

A test circuit of a semiconductor integrated circuit according to an aspect of the present invention comprises:

a test mode control circuit for judging on the basis of the test code whether or not the mode is a test mode and outputting a first test decode signal when the mode is the test mode;

a parallel-serial converting circuit arranged in the vicinity of the test mode control circuit for converting the first test code signal to the serial data in synchronization with the base clock;

a plurality of serial-parallel converting circuits for converting the serial data to a second test decode signal in synchronization with the base clock;

a plurality of test code latch circuits provided in correspondence to the plurality of internal circuits for latching the second test decode signal while decoding the second test decode signal to select one of the plurality of internal circuits and outputting a test select signal for changing the characteristics of the selected internal circuit out of the plurality of internal circuits;

a first test decode line for transmitting the first test decode signal from the test mode control circuit to the parallel-serial converting circuits;

a serial data line for transmitting the serial data from the parallel-serial converting circuit to the plurality of serial-parallel converting circuits;

a plurality of second test decode lines for transmitting the second test decode signal from the plurality of serial-parallel converting circuits to the plurality of test code latch circuits; and a plurality of test select signal lines for transmitting the test select signal from the plurality of test code latch circuits to the plurality of internal circuits.

The plurality of test code latch circuits are arranged in the vicinity of the plurality of internal circuits so that the length of the plurality of the test select signal lines becomes shorter than a definite length while the plurality of serial-parallel converting circuits are arranged in the vicinity of the plurality of test code latch circuits and the serial data lines are longer than the average length of the plurality of test select signal lines.

The plurality of test code latch circuits are arranged in a collected manner respectively at one or more locations of the area which is separated from the test mode control circuit by a definite distance.

A test method of a semiconductor integrated circuit according to an aspect of the present invention comprises the steps of:

decoding a test code for selectively changing the characteristic of a plurality of internal circuits arranged on the semiconductor chip;

converting n (n is a natural number) bit test code input into the semiconductor chip in a parallel manner into serial data when the test is conducted by changing the characteristic of the internal circuit selected with the test code;

transmitting serial data to a location in the vicinity of the plurality of internal circuits with one serial data line;

converting serial data into n bit parallel data in the vicinity of the plurality of internal circuits;

creating a test select signal for selecting one of the plurality of internal circuits on the basis of the parallel data; and changing the characteristic of the internal circuits selected with the test select signal;

2.-2. First Example

Figure 3:
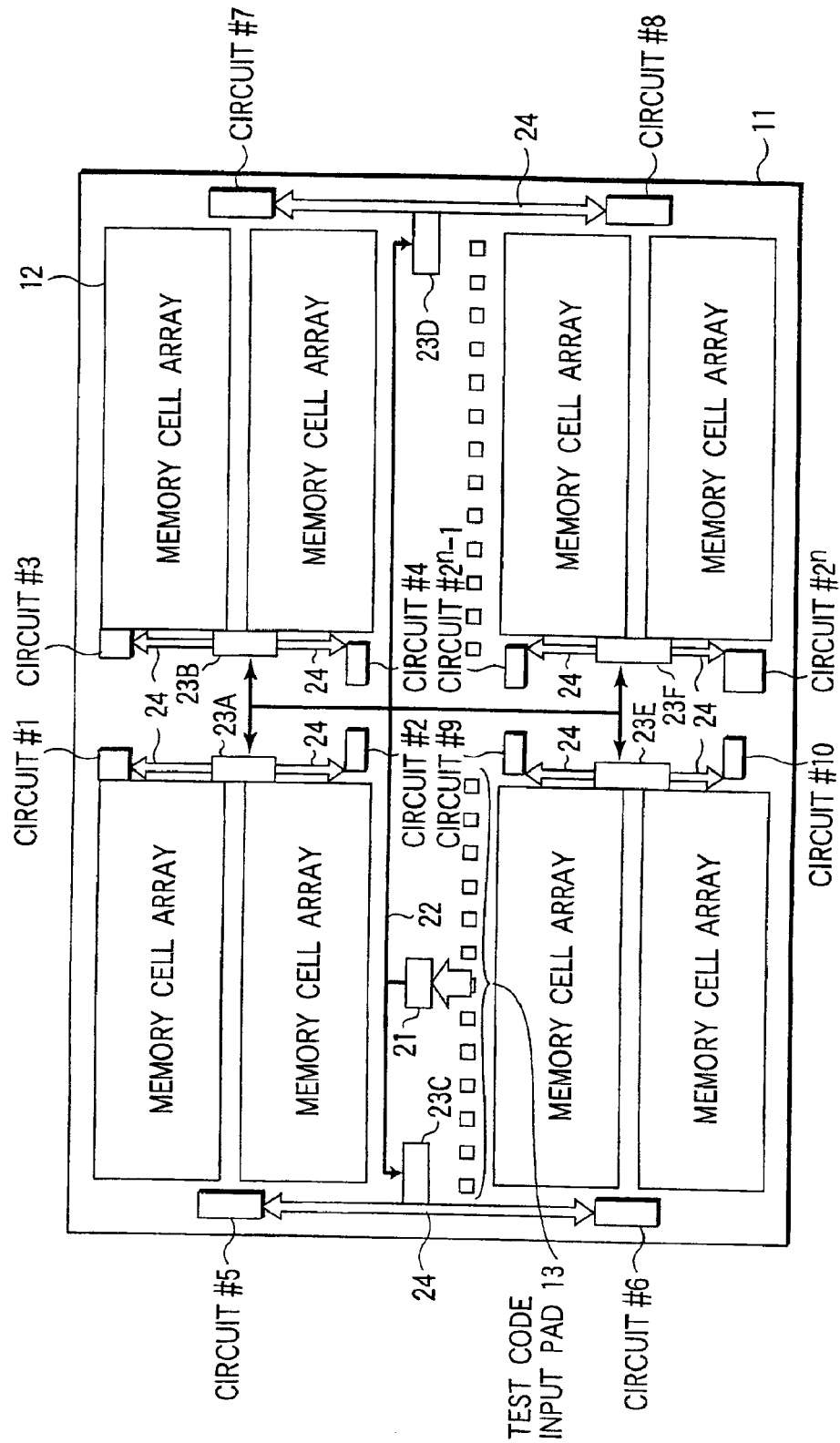
FIG. 3 is a view showing a first example of a layout of the semiconductor memory as an embodiment of the present invention.

FIG. 3 is a view showing a first example of a layout (floor plan) on the semiconductor chip of the semiconductor memory as an embodiment of the present invention.

On the semiconductor chip 11, a plurality of memory cell arrays 12 are arranged. On the peripheral portion of each memory cell array 12, a peripheral circuit is arranged for controlling the operation of the semiconductor memory. In this example, as a peripheral circuit, twelve internal circuits #1, #2, #3, #4, . . . #$2^n$-1, and $2^n$ are shown (corresponding to FIG. 1).

The pad 13 is arranged in the central portion of the semiconductor chip 11. The pad 13 has a function of inputting an address signal, a control signal, a reference signal or the like, for example, at the time of normal operation while a part of the pad 13 functions as a test code input pad for inputting a control signal including a test address signal, a test mode entry signal at the time of the test.

Incidentally, the pad 13 may be arranged on the fringe portion of the semiconductor chip 11 instead of the central portion of the semiconductor chip 11.

In the vicinity of the test code input pad 13, the test mode control circuit 21 is arranged. The test mode control circuit 21 outputs a control signal (test control signal) including a test mode entry signal which is synchronized with the base clock after recognizing the test mode on the basis of the test address signal (key code) input into the semiconductor chip 11 from the test code input pad 13. Furthermore, after the test mode is recognized, the test mode control circuit 21 creates the test decode signal on the basis of the test address signal (test code) input after the semiconductor chip 11 from the test code input pad 13.

The test decode signal is input to the test code latch circuits 23A, 23B, . . . 23F in synchronization with the control signal (test control signal) including the test mode entry signal via the test decode line 22.

Here, unlike the collected arrangement type layout (FIG. 1), the test code latch circuits 23A, 23B, . . . 23F are uniformly dispersed and arranged on the semiconductor chip 11. Specifically, the test code latch circuits 23A, 23B, . . . 23F are not arranged on one location in a collected manner. For example, the test code latch circuits 23A, 23B, . . . 23F are dispersed and arranged on the semiconductor chip 11 so that the length of the test select signal line 24 for connecting the test code latch circuits 23A, 23B, . . . 23F and the internal circuits (tested circuit) #1, #2, #3, . . . #$2^n$–1, and $2^n$ becomes shorter than the definite value.

In the case of such dispersed arrangement type layout, it is required that the test mode control circuit 21 connects the test mode control circuit 21 and the test code latch circuits 23A, 23B, . . . 23F dispersed and arranged on the semiconductor chip 11 with the result that the length of the test code line 22 becomes very long.

However, the test code line 22 is a signal line for transmitting the test decode signal TMcode1 to n and bTMcode1 to n before decoding. That is, in this example, since the test decode lines 22 are 2×n lines, it is possible to decrease the influence of the increase in the chip area along with an increase in the number of test items as compared with the collected arrangement type layout.

For example, when a case in which the number of test items is 256 (=$2^8$) is investigated, in the collected arrangement type layout (FIG. 1), 256 test select signal lines must be arranged from end to end of the semiconductor chip 11 while 16 (=2×8) test decode lines may be arranged from end to end of the semiconductor chip 11 in the dispersed arrangement type layout of the example.

Incidentally, the control signal including the test mode entry signal is input to the test code latch circuits 23A, 23B, . . . 23F. At the time of the test mode, the test decode signal TMcode1 to n and bTMcode1 to n are latched with the test code latch circuits 23A, 23B, . . . 23F. The test code latch circuits 23A, 23B, . . . 23F decode the test decode signals TMcode1 to n, bTMcode1 to n to create the test select signals TM(1), TM(2), . . . TM($2^n$–1), and TM($2^n$).

The test select signals TM(1), TM(2), . . . TM($2^n$–1), and TM($2^n$) are input to the internal circuits (tested circuits) #1, #2, . . . #$2^n$–1 and #$2^n$ via the test select signal 24. The characteristic (or the operation) of the internal circuits #1, #2, . . . #$2^n$–1 and #$2^n$ is determined with the test select signals TM (1), TM (2), . . . , TM ($2^n$–1) and TM ($2^n$).

According to the dispersed arrangement type layout as described above, as compared with the collected arrangement type layout, the rate of the increase in the chip size due to the increase in the number of test items can be reduced.

The characteristic of the dispersed arrangement layout as compared with the collected arrangement type layout (FIG. 1) is that the test code latch circuit is substantially dispersed and arranged on the semiconductor chip while at least one of test decode lines for connecting the test mode control circuit and the test decode latch circuit becomes longer than the average length of the test select signal line for connecting the test code latch circuit and the internal circuit (test circuit).

Incidentally, the "average length of the test select signal line" means that one or several signal lines (dummy test select signal lines) which are not used in the actual test is arranged between the test code latch circuit and the internal circuits, and the signal line is made very long is also included in the range of the right.

Furthermore, at least one test decode line may be set longer than at least half or more of the plurality of test select signal lines. Furthermore, at least one of the test decode lines may be set longer than all the plurality of test select signal lines.

Furthermore, the expression that the "test code latch circuit is substantially dispersed and arranged on the semiconductor chip" means that the internal circuits other than the test code latch circuits are present between the plurality of test code latch circuits while other internal circuits are not present between the plurality of test code latch circuits and only a plurality of test code latch circuits are separated by a definite distance.

Figure 4:
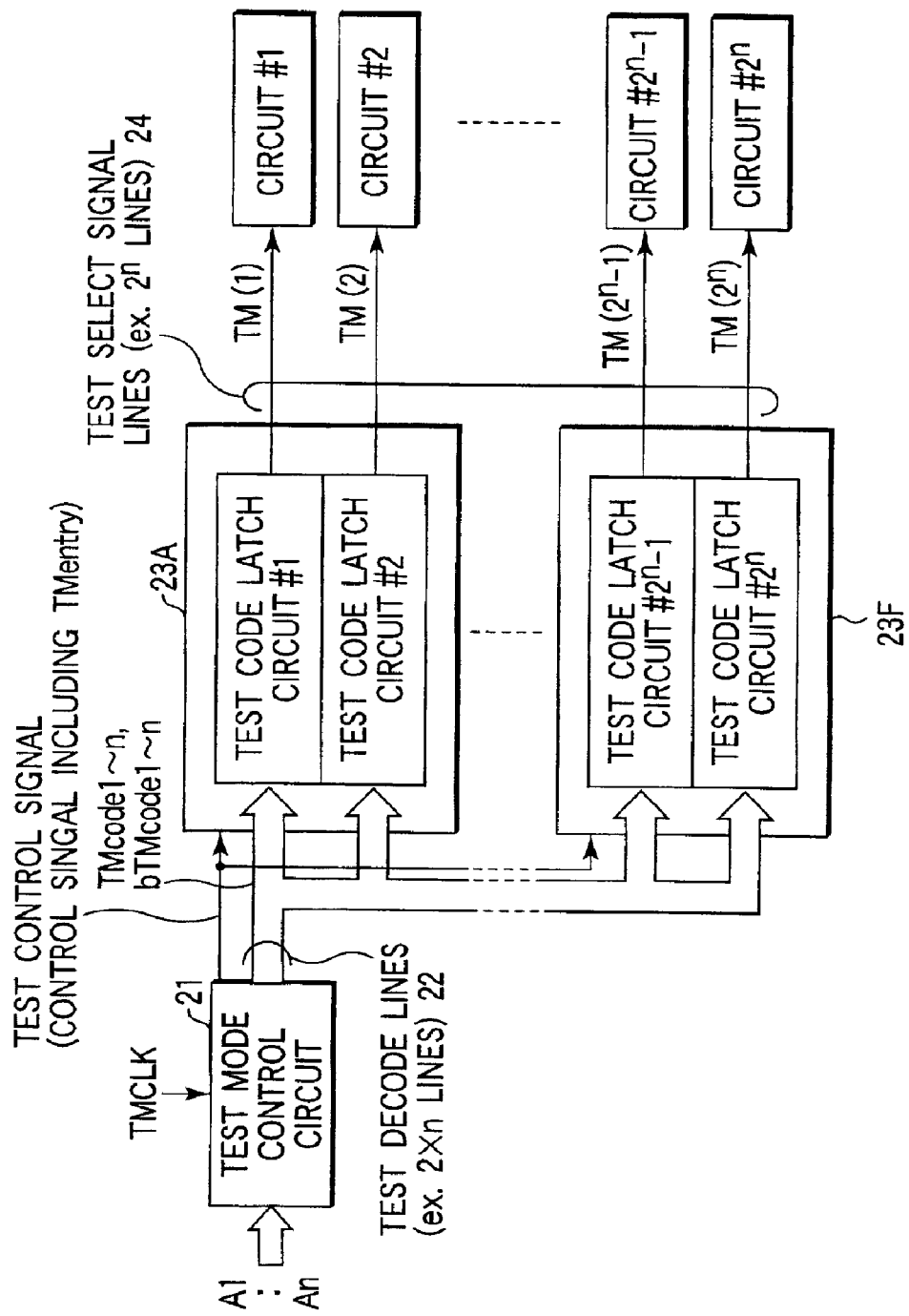
FIG. 4 is a view showing one example of a test circuit in the semiconductor memory of FIG. 3.

FIG. 4 is a view showing in detail the test circuit of the semiconductor integrated circuit of FIG. 3.

The characteristic of the test circuit of the example is that a plurality of test code latch circuits are dispersed as compared with the test circuit of FIG. 2 and each test code latch circuit is arranged in the vicinity of the circuit to be tested (internal circuit for changing the characteristics). As a consequence, the length of the test select signal lines which are present only for the number of test items can be made shorter so the an increase in the chip size resulting from an increase in the number of test items can be suppressed.

Hereinafter, an operation of the test circuit in this example will be briefly explained.

At the time of the test mode, the base clock TMCLK for controlling the operation of the test circuit is input to the semiconductor chip via a predetermined pad. For example, at the time of the normal operation, the pad for the reference signal for inputting a definite potential can be used as a pad for inputting the base clock TMCLK.

In synchronization with the base clock (latch signal) TMCLK, the test address signals A1, . . . An are input to the test mode control circuit 21. The test mode control circuit 21 recognizes whether or not the mode is the test mode on the basis of the test address signals A1, . . . An.

For example, in the case where the test address signals A1, . . . An are input at least once or more (the value of the test address signals A1, . . . An may be changed for each input in the case of inputting data twice or more), the test mode is recognized with the test mode control circuit 21 in the case where a combination of the test address signals A1, . . . An (corresponding to Key 1 and Key 2 of FIG. 8) input at least once or more represents the test mode entry.

Then, after that, the test address signals A1, . . . An (corresponding to Code of FIG. 8) input into the semiconductor chip are incorporated into the test mode control circuit 21 as a test address (test code).

After that, the test mode control circuit 21 creates a control signal including a test mode entry signal TMentry which is synchronized with the base clock TMCLK while creating the test decode signals TMcode 1 to n and bTMcode 1 to n on the basis of the test address signals A1 to An (n is a natural number).

In this example, the test decode signals TMcode1 to n, and bTMcode 1 to n are transmitted from the test mode control circuit 21 to the test code latch circuits 23A, 23B, . . . 23F with 2×n test decode lines 22. Incidentally, bTMcode 1 to n are inverse signals of the TMcode 1 to n.

The test code latch circuits 23A, 23B, . . . 23F are synchronized with the control signal including the test mode entry signal TMentry synchronized with the base clock TMCLK to latch the test decode signals Mcode 1 to n and bTMcode 1 to n. The test code latch circuits 23A, 23B, . . . 23F corresponds to the 2n internal circuits #1, #2, . . . #$2^n$–1, and $2^n$ which becomes a test object and comprises 2n test code latch circuits #1, #2, . . . #$2^n$–1, and $2^n$.

That is, $2^n$ internal circuits #1, #2, . . . #$2^n$–1, and $2^n$ and $2^n$ test decode latch circuits #1, #2, . . . #$2^n$–1, and $2^n$ correspond to each other on a one to one basis. Furthermore, $2^n$ internal circuits #1, #2, . . . #$2^n$–1, and $2^n$ and $2^n$ test code latch circuits #1, #2, . . . #$2^n$–1, and $2^n$ are connected to each other with $2^n$ test select signal lines.

Test code latch circuits #1, #2, . . . #$2^n$–1, and $2^n$ decode the test decode signals TMcode1 to n and bTMcode1 to n. As a consequence, one out of $2^n$ test code latch circuits #1, #2, . . . #$2^n$–1, and $2^n$ is selected, and an output signal (test select signal) of the selected test code latch circuit is set to the selected state (for example, "H").

Furthermore, an output signal (test select signal) of the remaining $2^n$–1 test code latch circuits are not set to the selected state (for example, "L").

Then, the characteristics (or operation) of the internal circuit #i corresponding to the selected test code latch circuit #i (i is one out of 1 to $2^n$) is changed with the test select signal TM (i). Furthermore, the characteristics (or operation) of the internal circuits corresponding to the non-selected test code latch circuit is not changed.

Incidentally, in the case where the characteristic (or operation) of the plurality of internal circuits are changed, the above operation is repeatedly conducted.

By the way, the control signal including the test mode entry signal TMentry may be input to the test code latch circuit 23 with an original signal line. Furthermore, instead of this, the test code signals TMcode1 to n and bTMcode 1 to n may be input to the test decode latch circuit 23 by using the test code line 22 before inputting the signals to the test code latch circuit 23.

Furthermore, in this example, the test decode signals are TMcode 1 to n and bTMcode 1 to n. Instead of this, bTMcode 1 to n are omitted and the test decode signals may be only TMcode1 to n.

Furthermore, the value of n in the above test circuit is determined with the number of test items (corresponding to the total of the test code latch circuits #1, #2, . . . #$2^n$–1, and $2^n$). For example, when the number of test items is 256, n=8 is provided.

In the test circuit of the semiconductor integrated circuit described above, it is possible to change the characteristic of the internal circuits formed in the semiconductor chip with the test select signal. Consequently, the evaluation efficiency of the internal circuits in the product development can be improved, and the test time can be shortened with the result that the cost reduction of the product can be realized.

Furthermore, a layout is adopted in which the length of the test select signal line having the number equal to the number of test items is shorter than the definite value while the length is shorter than the length of at least one of the test decode lines. Consequently, even when the number of test items is increased, the chip size is not extremely enlarged.

Furthermore, in the test circuit of the present invention, the dispersed arrangement type layout is adopted, so that the test select signal for directly determining whether or not the characteristic of the internal circuits are changed is guided from the test code latch circuit to the internal circuits via the test select signal line which is shorter than the definite value.

That is, since the test select signal line is very short, it does not happen that noises are generated on the select signal line with the capacity coupling. In particular, noises cease to be generated on the test select signal line resulting from the power source noise at the time of the normal operation. Consequently, at the time of the normal operation, an operation error of the test circuit (change of the characteristic of the internal circuits) can be prevented.

Incidentally, in the dispersed arrangement type layout, the length of the test select signal line is shortened whereas the length of the test decode line is prolonged. However, even when noises are generated in the test decode line with the capacity coupling, the test code latch circuit is not operated unless entered the test mode. Consequently, the test circuit is not erroneously operated at the time of a normal operation because of such a phenomenon.

2.-3. Second Embodiment

In the above example, the test circuit is arranged in a so-called dispersed arrangement type layout with the result that even when the number of test items increases the wiring area is not extremely increased and an increase in the chip size is suppressed.

However, in the dispersed arrangement type layout, the test decode line for connecting the test mode control circuit and the test code latch circuit is extremely prolonged. The number of the test decode lines is very few as compared with the test select signal for connecting the test code latch circuit and the internal circuit, but there are 2×n lines (n lines in the case where no inverse signal is used).

That is, the chip size increases with an increase in the number of test items in the dispersed arrangement type layout though the increase is smaller than the case of the collected arrangement type layout (FIG. 1).

For example, investigation is made on a case in which the number of test items is 256.

In this case, n=8 is provided, and the total number of test decode lines (corresponding to the number of the test decode signals TMcode 1 to n and bTMcode 1 to n) becomes 16 (2×8) lines. Here, assuming that the wiring pitch is 2 $\mu$m, the wiring width of the whole test decode line width requires at least 32 $\mu$m.

Furthermore, generally, since the circuits to be tested (internal circuits which become an object of operation change) are dispersed and arranged on the whole semiconductor chip, the test decode line must be extended at least from end to end in the horizontal direction of the semiconductor chip, namely, from end to end in the vertical direction of the semiconductor chip.

Even when it is assumed that the chip size is set to 10 mm33 5 mm=50 mm$^2$, an area required for the test decode line becomes 0.032 mm×(10 mm+5 mm)=0.48 mm$^2$.

That is, the area required for the test decode line becomes a value which is less than 1% with respect to the chip area. However, in recent years when it becomes difficult to improve the integration degree of the device, the situation is such that even a small value of less than 1% cannot be ignored. Furthermore, for the test circuit required for the test operation which is not associated with the normal operation at all, an increase in the chip size is extremely wasteful even if the area is small.

Then, in the second example, the wiring area for the test can be reduced while the scale of the test circuit (in particular, the wiring area) can be constantly maintained approximately on a definite level irrespective of the number of test items. Thus, there will be explained a test circuit which can contribute to the reduction in the chip size.

Figure 5:
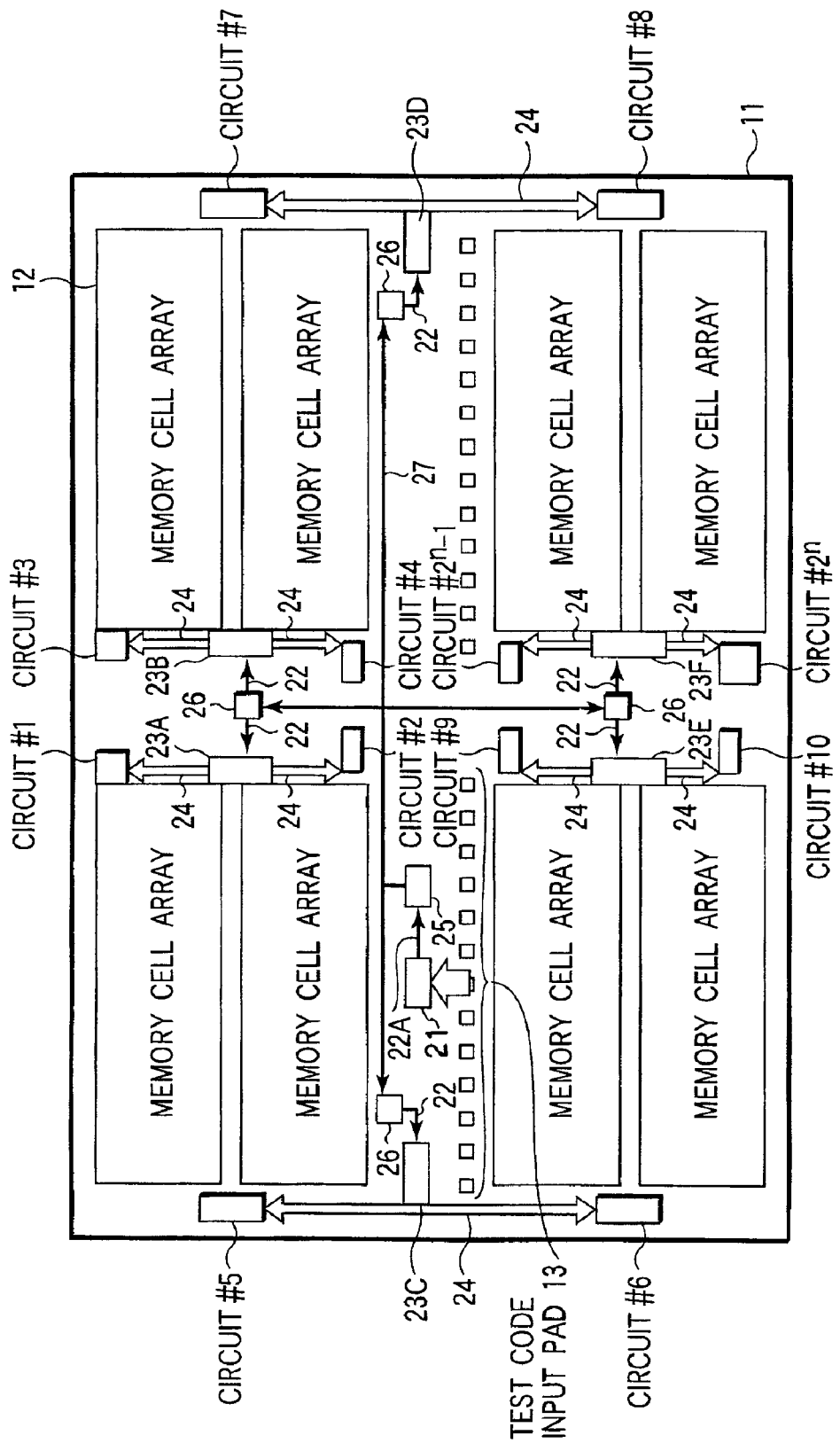
FIG. 5 is a view showing a second example of the layout of the semiconductor memory as the embodiment of the present invention.

FIG. 5 is a view showing a second example of a layout (floor plan) on the semiconductor chip of the semiconductor memory as an embodiment of the present invention.

The characteristic of the layout of the present embodiment is that a parallel-serial converting circuit 25 is arranged in the vicinity of the test mode control circuit 21, a serial-parallel converting circuit 26 is arranged in the vicinity of a plurality of test code latch circuits 23A, 23B, . . . 23F dispersed and arranged on the semiconductor chip, and the test decode signal is continuously transmitted (serial transmission) with one test decode line (serial data line) 27.

This enables settling an increase in the wiring area for the test decode signal resulting from an increase in the number of test items which becomes a problem in the dispersed arrangement type layout.

Hereinafter, a layout associated with this example will be explained in detail.

On the semiconductor chip, a plurality of memory cell arrays 12 are arranged while on the periphery of each of the memory cell arrays 12, peripheral circuits for controlling an operation of the semiconductor memory are arranged. In this example, twelve internal circuits #1, #2, #3, #4, . . . #$2^n$–1 and #$2^n$ are shown (corresponding to FIG. 3).

The pad 13 is arranged in the central portion of the semiconductor chip 11. The pad 13 has a function of inputting an address signal, a control signal, and a reference signal, for example, at the time of the normal operation. A part of the pad 13 functions as a test code input pad for inputting a control signal including a test address signal, and a test entry signal at the time of the test.

Incidentally, the pad 13 may be arranged on the fringe portion of the semiconductor chip 11 instead of the central portion of the semiconductor chip 11.

In the vicinity of the test code input pad 13, the test mode control circuit 21 is arranged. After the test mode control circuit 21 recognizes the test mode on the basis of the test address signal (key code) input into the semiconductor chip 11 from the test code input pad 13, a control signal (test control signal) including the test mode entry signal which is synchronized with the base clock signal is output. Furthermore, after the test mode is recognized, the test mode control circuit 21 creates a test decode signal on the basis of the test address signal (test code) subsequently input to the semiconductor chip 11 from the test code input pad 13.

The test decode signal is input to the parallel-serial converting circuit 25 in synchronization with the base clock via the test decode line 22A. The parallel-serial converting circuit 25 converts a test decode signal (parallel data) simultaneously (in a parallel manner) input from the test code input pad 13 into serial data.

This serial data is input in an order of time to the serial-parallel converting circuit 26 via one serial data line 27. Furthermore, the serial-parallel converting circuit 26 converts serial data into parallel data in synchronization with the base clock. Here, the serial-parallel converting circuit 26 is arranged in the vicinity of the test code latch circuits 23A, 23B, . . . 23F dispersed and arranged on the semiconductor chip 11.

The parallel data (test decode signal) is input to the test code latch circuits 23A, 23B, . . . 23F via the test decode line 22. Furthermore, the control signal (test control signal) including the test mode entry signal is also input to the test code latch circuits 23A, 23B, . . . 23F.

At the time of the test mode, the test decode signal is latched with the test code latch circuits 23A, 23B, . . . 23F in synchronization with the test control signal which is synchronized with the clock signal. Furthermore, the test code latch circuits 23A, 23B, . . . 23F decode the test decode signal to create a test select signal for changing the characteristic of internal circuit.

A test select signal is input to the internal circuits (circuits to be tested) #1, #2, . . . #$2^n$–1, and $2^n$ via the test select signal line 24. The characteristic (or operation) of the internal circuits #1, #2, . . . #$2^n$–1, and $2^n$ is determined with the test select signal.

In the test circuit of the example, the dispersed arrangement type layout (FIG. 3) is adopted while one serial data line 27 is arranged from end to end of the semiconductor chip 11 instead of the test decode line in order to prevent an increase in the chip size by the test decode line.

That is, in the vicinity of the test mode control circuit 21, the parallel-serial converting circuit 25 is arranged while in the vicinity of the plurality of test code latch circuits 23A, 23B, . . . 23F dispersed and arranged on the semiconductor chip, the serial-parallel converting circuit 26 is arranged. Thus, the parallel-serial converting circuit 25 and the serial-parallel converting circuit 26 are connected to each other with one serial data line 27.

As a consequence, for example, in the dispersed arrangement type layout of FIG. 3, 2×n test decode lines extending in a vertical and horizontal directions on the semiconductor chip 11 are required in order to transmit the test decode signals TMcode 1 to n and bTMcode 1 to n so that the chip size is increased because of an increase in the number of test items. In the layout of this example, only one serial data line 27 may be provided on the semiconductor chip 11 in order to transmit the test decode signals TMcode 1 to n. Even when the number of test items increases, the chip size is not increased.

Incidentally, in the test circuit of this example, for example, the test decode signals (including the inverse signal) TMcode 1 to n and bTMcode 1 to n may only be created in the serial-parallel converting circuit 26 with the result that only test decode signals (not including an inverse signal) TMadd1 to n may be transmitted from the test mode control circuit 21 to the parallel-serial converting circuit 25.

Furthermore, after the test decode signals (no including an inverse signal) TMadd1 to n are converted into serial data, the signals are transmitted to the serial-parallel converting circuit 26 via the serial data line 27.

FIG. 6 is a view showing in detail a test circuit of the semiconductor integrated circuit of FIG. 5.

The characteristic of the test circuit of the present example lies in that the parallel-serial converting circuit 25, the serial-parallel converting circuit 26 and the serial data line 27 are newly provided as compared with the test circuit of FIG. 4. As a consequence, even when the number of test items increases, an increase in the chip size can be prevented.

Hereinafter, an operation of the test circuit of the example will be briefly explained.

At the time of the test mode, the base clock TMCLK for controlling the operation of the test circuit is input to the semiconductor chip via the predetermined pad. For example, at the time of the normal operation, a pad for the reference signal for inputting a definite potential can be used as a pad for inputting the base clock TMCLK at the time of the test mode.

In synchronization with the base clock (latch signal) TMCLK, the test address signals A1, . . . An are input to the test mode control circuit 21. The test mode control circuit 21 recognizes whether or not the mode is the test mode on the basis of the test address signals A1, . . . An.

For example, in the case where the test address signals A1, . . . An are input at least one or more, (when the signals are input twice or more, the value of the test address signals A1, . . . An may be changed), a combination of test address signals A1, . . . An (corresponding to Key 1, and Key 2) input at least once or more represents an entry, the test mode control circuit 21 recognizes the test mode.

Furthermore, the test address signals A1, . . . An (corresponding to code of FIG. 8) subsequently input into the semiconductor chip are taken into the test mode control circuit 21 as a test address (test code).

After this, the test mode control circuit 21 creates a control signal including a test mode entry signal TMentry which is synchronized with the base clock TMCLK while the test decode signals TMadd 1 to n (n is a natural number) are created on the basis of the test address signals A1, ... An.

In this example, the test decode signals TMadd1 to n are transmitted from the test mode control circuit 21 to the parallel-serial converting circuit 25 with n test decode signals 22A.

The parallel-serial converting circuit 25 converts the test decode signals TMadd1 to n into serial data TMcode SD in synchronization with the base clock TMCLK. The serial data TMcode SD is input to the serial-parallel converting circuit 26 via the serial data line 27. The serial-parallel converting circuit 26 creates test decode signals TMcode1 to n and bTMcode1 to n on the basis of the serial data Tmcode SD.

Here, the operation of the parallel-serial converting circuit 25 and the operation of the serial-parallel converting circuit 26 are controlled with the base clock TMCLK respectively. Furthermore, the base clock TMCLK is input to the parallel-serial converting circuit 25 while the clock is transmitted from the parallel-serial converting circuit 25 to the serial-parallel converting circuit 26.

That is, in the test circuit of the present example, a signal line provided from end to end of the semiconductor chip 11 are two lines: the serial data line 27 and the base clock line 28. The number of signal lines is constant at all times irrespective of the number of test items.

Incidentally, in the test circuit, a signal line becomes necessary for transmitting the test control signal (control signal including a test mode entry signal TMentry) created at the test mode control circuit 21 to the parallel-serial converting circuit 25, the serial-parallel converting circuit 26, and the test code latch circuits 23A, 23B, ... 23F respectively. This signal line becomes necessary in the reference example (FIGS. 1 and 2) and the first example (FIGS. 3 and 4) of the present invention.

Besides, naturally, the test control signal (a control signal including a test mode entry signal TMentry) may be transmitted to the test code latch circuit 23A, 23B ... 23F from the test mode control circuit 21 by using signal lines 22, 22A and 27 not from an original signal.

The test code latch circuits 23A, 23B, ... 23F latch the test decode signals TMcode1 to n, bTMcode1 to n in synchronization with the test control signal which is synchronized with the base clock signal TMCLK. The test code latch circuits 23A, 23B ... 23F comprise $2^n$ test code latch circuits #1, #2, ... #$2^n$-1 and #$2^n$ in correspondence to $2^n$ internal circuits which becomes a test object.

That is, $2^n$ internal circuits #1, #2, ... #$2^n$-1 and $2^n$ and $2^n$ test code latch circuits #1, #2, ... #$2^n$-1 and $2^n$ correspond to each other on a one-to-one basis. Furthermore, $2^n$ internal circuits #1, #2, ... #$2^n$-1 and $2^n$ and $2^n$ test code latch circuits #1, #2, ... #$2^n$-1 are connected to each other with $2^n$ test select signal lines.

The test code latch circuits #1, #2, ... #$2^n$-1 and $2^n$ decode the test decode signals TMcode1 to n and bTMcode1 to n. As a consequence, one of $2^n$ test code latch circuits #1, #2, ... #$2^n$-1 and $2^n$ is selected and an output signal (test select signal) of one selected test code latch circuit is set in a selected state (for example, "H").

Furthermore, the output signal (test select signal) of the remaining $2^n$-1 test code latch circuit is set to the non-selected state (for example, "L").

Then, the characteristic (or operation) of the internal circuits #i corresponding to the selected test code latch circuit #i (i is one out of 1 to $2^n$) is changed with the test select signal TM (i). Furthermore, the characteristic (or operation) of the internal circuits corresponding to the non-selected test code latch circuit is not changed.

Incidentally, in the case where the characteristic (or operation) of the plurality of internal circuits is changed, the above operation is repeatedly conducted.

In the test circuit of the above semiconductor integrated circuit, the characteristic of the internal circuits formed in the semiconductor chip can be changed with the test select signal. Consequently, the evaluation efficiency of the internal circuits in the product development can be improved while the test time can be shortened. Thus the cost reduction of the product can be realized with the cost reduction of the development.

Furthermore, the length of the test select signal lines in the same number as the number of test items is shorter than the definite value with the result that the chip size is not extremely increased even when the number of test items increases. Furthermore, after the test decode signals are converted into serial data, and this serial data is converted into parallel data, the signals are given to the test latch circuits dispersed and arranged on the semiconductor chip. Consequently, the signal line which is required to be arranged from end to end of the semiconductor chip are the serial data line and the base clock line, so that an increase in the chip size can be suppressed.

Furthermore, in the present invention, the dispersed arrangement type layout is adopted, so the test select signals TM1, TM2, ... TM ($2^n$-1), $2^n$ for directly determining whether or not the characteristic of the internal circuit is changed are guided from the test code latch circuit to the internal circuits via the test select signal line which is shorter than the definite value.

That is, since the test select signal line is very short, no noise is generated because of the capacity coupling. In particular, no noise is generated in the test select signal line resulting from the power source noise at the time of normal operation. Thus, an operation error (the change of the characteristic of the internal circuits) of the test circuit can be prevented at the time of the normal operation.

Incidentally, even when the noise is generated on the serial data line with the capacity coupling, the test code latch circuit is not operated unless an entry is made into the test mode with the result that the test circuit is not erroneously operated at the time of the normal operation because of such a phenomenon.

Figure 7:
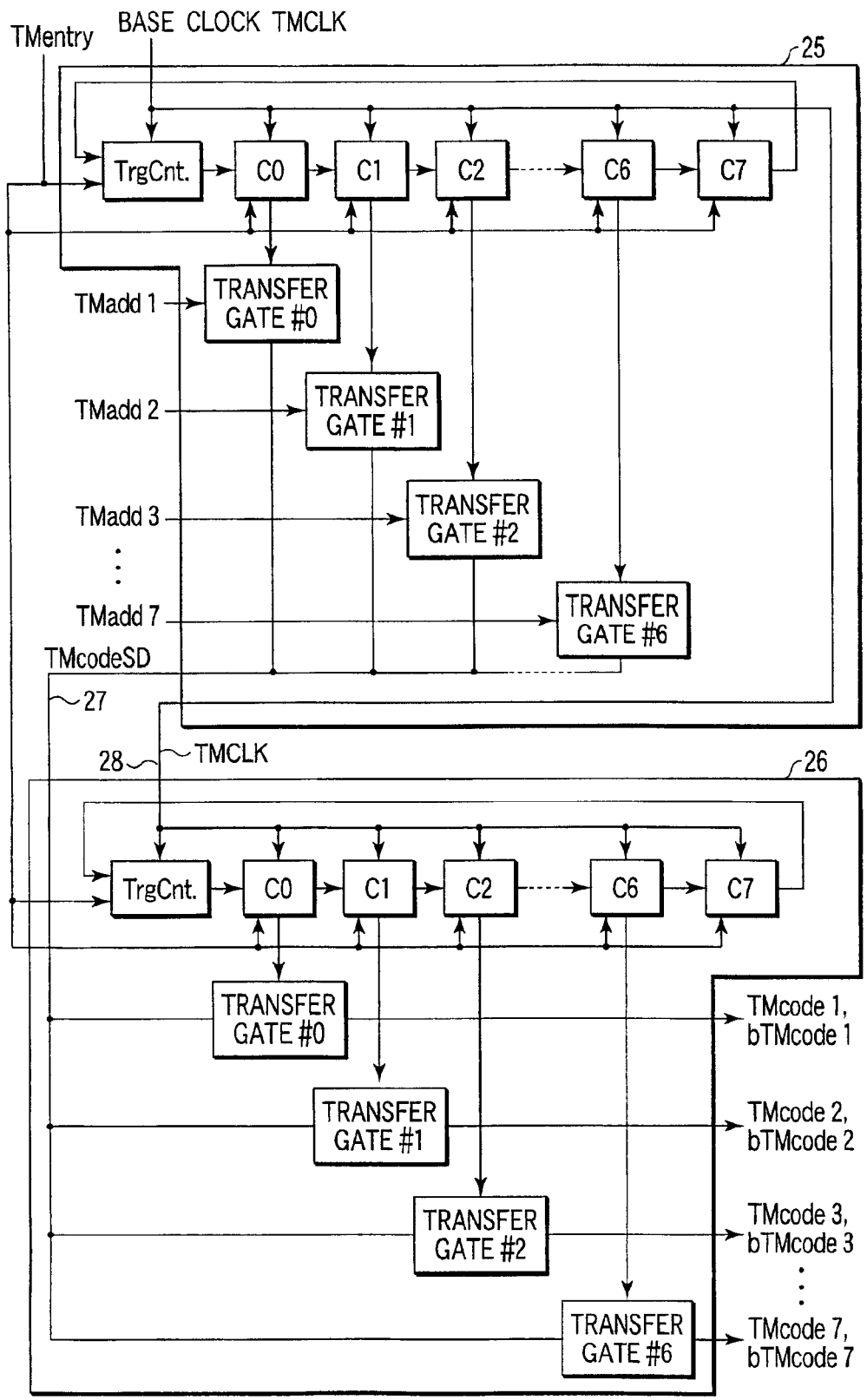
FIG. 7 is a view showing one example of a parallel·serial converting circuit and a view showing one example of a serial·parallel converting circuit.

FIG. 7 is a view showing an example of the parallel-serial converting circuit and the parallel-serial converting circuit of the test circuit of FIGS. 5 and 6. Furthermore, FIG. 8 is a view showing an operation of the parallel-serial converting circuit and the serial-parallel converting circuit of FIG. 7.

Figure 8:
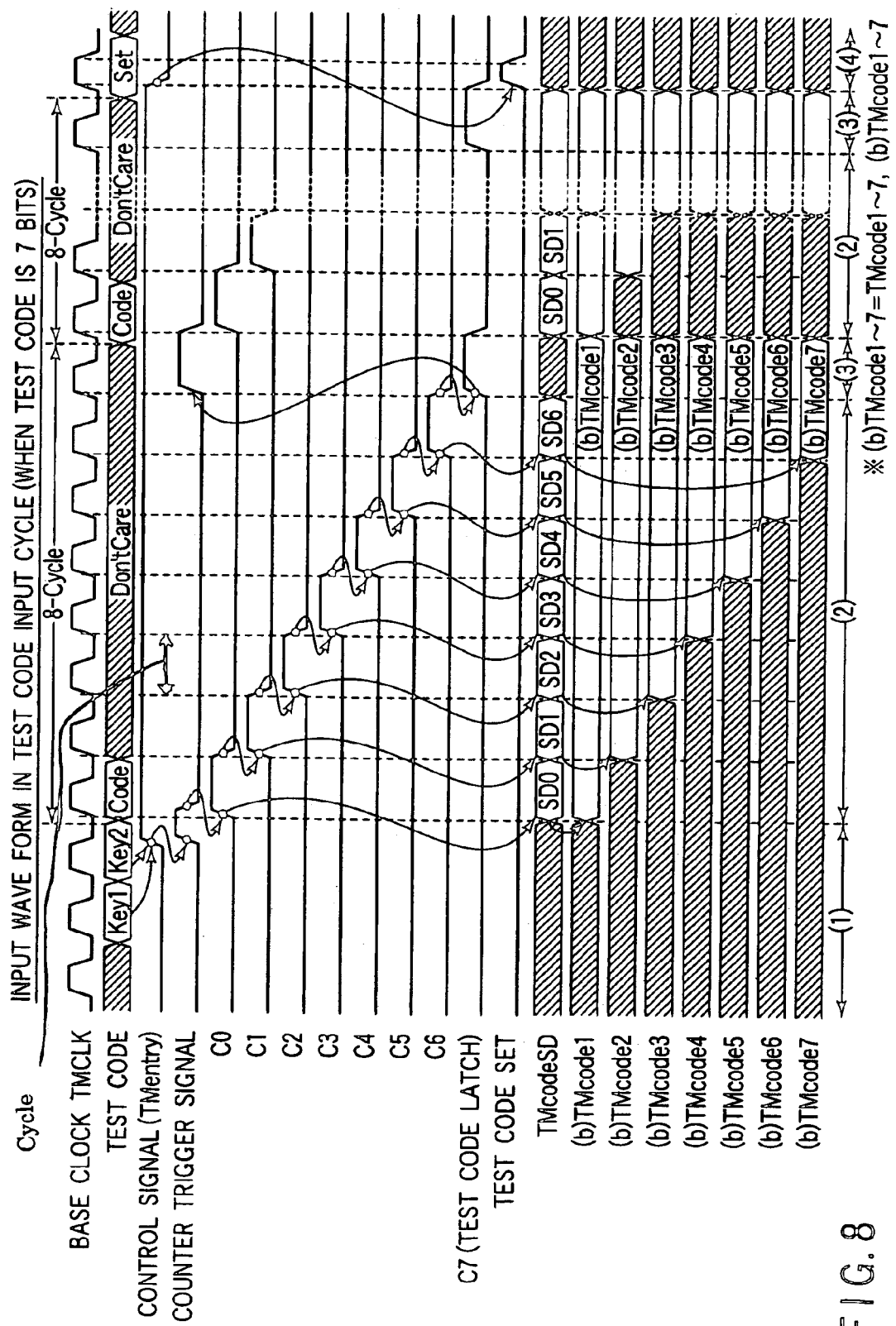
FIG. 8 is a view showing one example of a test code input cycle of the test mode.

Incidentally, FIG. 8 is a view showing an example of an input waveform of an input cycle of the test code on the supposition that the test code is 7 bits and the test mode entry signal TMentry is used as a test control signal for the simplification of the explanation.

(1) In the beginning, in the test mode entry cycle (period (1)), for example, when the key code Key 1=#1 and Key 2=#2 are continuously input, the test mode entry signal TMentry as the control signal becomes "H" to provide a test mode. That is, the test mode entry signal TMentry becomes "H" so that the count trigger circuit TgrCnt. and the counters C0, C1, ... C7 in the parallel-serial converting circuit 25 are set to an operating state. In a similar manner, the count trigger circuit TrgCnt. and the counters C0, C1, ... C7 in the serial-parallel circuit are set in an operating state.

(2) In the data transfer cycle (period (2)), in synchronization with the base clock TMOLK, the test codes Code (=TMadd 1 to 7) are taken into the parallel serial converting circuit 25.

Specifically, an output pulse is subsequently output from the counters C0, C1, ... C6 in synchronization with the base clock TMCLK. Along with this, the address decode signals TMadd1 to 7 are output to the serial data line 27 via the transfer gates #0, #1, ... #6 as the serial data TMcode SD (=SD0, SD1, ... SD6).

On the other hand, the serial-parallel converting circuit 26 subsequently takes the serial data TMcode SD (=SD0, SD1, ... SD6) in synchronization with the base clock TMCLK.

For example, when an output pulse is output from the counter C) in the parallel serial converting circuit 25, the address decode signal TMadd1 is output to the serial data line 27 via the transfer gate #0 (=TmcodeSD=SD0). At the same time, since an output pulse is output from the counter C0 in the serial-parallel converting circuit 26, the data TMcode SD (=SD0) of the serial data line 27 is taken into the serial-parallel converting circuit 26 via the transfer gate #0.

Then, the serial-parallel converting circuit 26 outputs the address decode signals TMcode1 and bTMcode1.

In a similar manner, all the address decode signals TMadd1 to 7 are incorporated into the serial-parallel converting circuit 26 while the address decode signal TMcode1 to 7 and bTMcode1 to 7 are output from the serial-parallel converting circuit 26.

(3) In the test code latch cycle (period (3)), the address decode signals TMcode1 to 7 and bTMcode 1 to 7 are latched into the test decode latch circuit (see FIG. 4).

Incidentally, for example, an output pulse of the counter C7 in the serial-parallel converting circuit 26 is used as the test code latch circuit. When an output pulse is output from the counter C7, the address decode signals TMcode 1 to 7 and bTMcode 1 to 7 are latched into the address code latch circuit.

After this, in accordance with the number of internal circuits for changing the characteristics thereof, cycles similar to the above cycles of (2) and (3) are repeatedly conducted.

Incidentally, in the case where the test code is continuously input, an output pulse of the counter C7 in the parallel-serial converting circuit 25 and the serial-parallel converting circuit 26 is used as a trigger at the time of transmitting the next text code.

(4) In the test code set cycle (period (4)), for example, an output signal (test select signal) TM (x) of the selected test code latch circuit (see FIG. 6) is set to "H" by inputting, the test mode set code Set from the outside of the semiconductor chip. At the same time, the test code input cycle of the test mode is ended.

Incidentally, in the present invention, the test decode signal is sent in a serial manner in synchronization with the base clock with the result that the input cycle time of the test code in the test mode becomes longer than the reference example (FIGS. 1 and 2) and the first example (FIGS. 3 and 4). However, an increase portion of the test time along with the serial transmission does not become a serious problem as compared with the whole test time.

As described above, on the basis of FIGS. 7 and 8, there has been explained a test code input cycle of the test mode. The circuit structure and an operation waveform of the parallel-serial converting circuit 25 and the serial-parallel converting circuit 26 are one example. It goes without saying that various modifications can be made.

3. OTHERS

In the layout on the semiconductor chip associated with the first and second embodiment, the test code latch circuits are dispersed and arranged approximately uniformly on the semiconductor chip. However, needless to say, the present invention can be applied even in the case where the test code latch circuits are not uniformly arranged and dispersed on the semiconductor chip.

For example, in the example (corresponding to the third embodiment) of FIG. 9, in the case where the area on the semiconductor chip is divided into two parts, the test code latch circuit is dispersed and arranged. Incidentally, in the example as well, at least one of the plurality of test decode lines 22 is longer than the average length of the plurality of the tests select signal lines 24.

Furthermore, in an example of FIG. 10 (corresponding to the third example), the test code latch circuits are arranged in a package at one location on the semiconductor chip. However, in this example as well, at least one of the plurality of test decode lines 22 becomes longer than the average length of the plurality of test select signal lines 24.

With respect to the layout on the semiconductor chip associated with the above first and second embodiments, a semiconductor memory is taken as an example. However, the present invention can be applied also to various semiconductor integrated circuits (for example, memory embedded logic LSI, ASIC or the like) in which the test circuit is incorporated in the semiconductor chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A test circuit of a semiconductor integrated circuit comprising internal circuits in a semiconductor chip comprising:

a test mode control circuit arranged in the vicinity of a pad for inputting a test code into the semiconductor chip for judging on the basis of the test code whether or not the mode is a test mode and outputting a test decode signal when the mode is the test mode;

test code latch circuits provided in correspondence to the internal circuits for latching the test decade signal while decoding the test decode signal to select one of the internal circuits and outputting a test select signal for changing the characteristics of the selected internal circuit out of the internal circuits;

test decode lines for transmitting the test decode signal from the test mode control circuit to the test code latch circuits; and test select signal lines for transmitting the test select signal from the test code latch circuit to the internal circuits;

wherein the test code latch circuits are dispersed in the semiconductor chip and at least one of the test decode lines is longer than an average length of the test select signal lines.

2. The test circuit according to claim 1, wherein the test code latch circuits are substantially dispersed and arranged on the semiconductor chip so that a length of the test select signal lines becomes shorter than a definite length.

3. The test circuit according to claim 1, wherein at least one of the test decode lines is longer than at least a half or mole of the test select signal lines.

4. The test circuit according to claim 1, wherein at least one of the test decode lines is longer than all the test select signal lines.

5. The test circuit according to claim 1, wherein the test decode signals is n bits, where n is a natural number, while the test select signal lines are $2^n+1$ or more, and $2^n$ or less.

6. The test circuit according to claim 1, wherein the number of the test code latch circuits and the number of the internal circuits are both $2^n-1+1$ or more and $2^n$ or more.

7. The test circuit according to claim 1, wherein said semiconductor chip is a memory chip.

8. The test circuit according to claim 1, wherein said semiconductor chip is a logic LSI chip.

9. The test circuit according to claim 1, wherein said semiconductor chip is a memory embedded logic LSI chip.

10. A circuit of a semiconductor integrated circuit comprising internal circuits in a semiconductor chip comprising:

a test mode control circuit arranged in the vicinity of a pad for inputting a test code in the semiconductor chip for judging on the basis of the test code whether or not the mode is a test mode and outputting a first test decode signal when the mode is the test mode;

a parallel serial converting circuit arranged in the vicinity of the test mode control circuit for converting the first test decode signal into serial data in synchronization with the base clock;

serial-parallel converting circuits for converting the serial data to a second test decode signal in synchronization with the base clock;

test code latch circuits provided in correspondence to the internal circuits for latching the second test decode signal while decoding the second test decode signal to select one of the internal circuits and outputting the test select signal for changing the characteristic of the selected internal circuit out of the internal circuits;

a first test decode line for transmitting the first test decode signal from the test mode control circuit to the parallel serial converting circuit;

serial data lines for transmitting the serial data from the serial-parallel converting circuit to the serial-parallel converting circuits;

second test decode lines for transmitting the second test decode signal from the serial-parallel converting circuits to the test code latch circuits; and test select signal lines for transmitting the test select signal from the test code latch circuits to the internal circuits;

wherein the test code latch circuits are dispersed in the semiconductor chip, the serial-parallel converting circuits are arranged in the vicinity of the test code latch circuits and the serial data lines are longer than an average length of the test select signal lines.

11. The test circuit according to claim 10, wherein the test code latch circuits are substantially dispersed and arranged on the semiconductor chip so that a length of the test select signal lines becomes shorter than a definite length.

12. The test circuit according to claim 10, wherein the serial data lines are longer at least than a half or more of the test select signal lines.

13. The test circuits according to claim 10, wherein the serial data lines are longer than all the test select signal lines.

14. The test circuit according to claim 10, wherein the first and second test decode signals are both n bits where n is a natural number, the first test decode line comprises n lines, and the second test decode lines are 2×n, and the test select signal lines are $2^{n-1}+1$ or more and $2^n$ or less.

15. The test circuit according to claim 10, wherein the number of the test code latch circuits and the number of the internal circuits are both $2^{n-1}+1$ or more and $2^n$ or less.

16. The test circuits according to claim 10, wherein the serial data is synchronized with the base clock to be transmitted from the parallel-serial converting circuit to the serial-parallel converting circuits.

17. The test circuit according to claim 10, wherein the base clock is supplied from the parallel serial converting circuit serial-parallel converting circuits via the base clock line.

18. A test circuit of a semiconductor integrated circuit comprising internal circuits in a semiconductor chip comprising:

a test mode control circuit for judging on the basis of the test code whether or not the mode is a test mode and outputting a test decode signal when the mode is the test mode;

test code latch circuits provided in correspondence to the internal circuits for latching the test decode signal while decoding the test decode signal to select one of the internal circuits and outputting the test select signal for changing the characteristic of the selected internal circuit out of the internal circuits;

test decode lines for transmitting the test decode signal from the test mode control circuit to the test code latch circuits; and test select signal lines for transmitting the test select signal from the test code latch circuits to the internal circuits, the test code latch circuits are dispersed in the semiconductor chip, the test code latch circuits are arranged so that a length of the test select signal lies become shorter than a definite value while at least one of the test decode lines is longer than an average length of the test select signal lines;

wherein the test code latch circuits are substantially dispersed and arranged on the semiconductor chip, and are arranged in the vicinity of the internal circuits.

19. The test circuit according to claim 18, wherein the test code latch circuits are arranged in a package at one or more locations separate from the test mode control circuit by a definite distance.

20. A test circuit of a semiconductor integrated circuit comprising internal circuits in a semiconductor chip comprising:

a test mode control circuit for judging on the basis of the test code whether or not the mode is a test mode and outputting a first test decode signal when the mode is the test mode;

a parallel serial converting circuit arranged in the vicinity of the test mode control circuit for converting the first test decode signal into serial data in synchronization with the base clock;

serial-parallel converting circuits for converting the serial data into the second test decode signal in synchronization with the base clock;

test code latch circuits provided in correspondence to the internal circuits for latching the second test decode signal while decoding the second test decode signal to select one of the internal circuits and outputting the test select signal for changing the characteristic of the selected internal circuit out of the internal circuits;

a first test decode line for transmitting the first test decode signal from the test mode control circuit to the parallel serial converting circuit;

serial data lines for transmitting the serial data from the parallel serial converting circuit to the serial-parallel converting circuits; and second test decode lines for transmitting the test decode signal from the serial-parallel converting circuit to the test code latch circuits; and test select signal lines for transmitting the test select signal from the test code latch circuits to the internal circuits, the test code latch circuits are dispersed in the semiconductor chip, the test code latch circuits are arranged so that a length of the test select signal lines becomes shorter than a definite value, the serial-parallel converting circuits are arranged in the vicinity of the test code latch circuits, and the serial data line is longer than an average length of the test select signal lines;

wherein the test code latch circuits are substantially dispersed and arranged on the semiconductor chip, and are arranged in the vicinity of the internal circuits.

21. The test circuit according to claim 20, wherein the test code latch circuits are arranged in a package at one or more locations separate from the test mode control circuit by a definite distance.

22. A test method of a semiconductor integrated circuit comprising internal circuits in a semiconductor chip comprising:

converting n bit test code input, n is a natural number, in a parallel manner into the semiconductor chip into serial data;

transmitting the serial data to the vicinity of the internal circuits with one serial data line;

converting the serial data into n bit parallel data in the vicinity of the internal circuits;

creating and transmitting a test select signal on a test select signal line from test code latch circuits to the internal circuits for selecting one of the internal circuits on the basis of the parallel data; and changing the characteristic of the selected internal circuits with the test select signal, wherein the serial data line is longer than an average length of the test select signal line and wherein the rest code latch circuits are dispersed in the semiconductor chip.

23. The method according to claim 22, wherein after the characteristic of the selected internal circuits is changed, the test of the internal circuits is conducted.

24. The test method according to claim 22, wherein said semiconductor chip is a memory chip.

25. The test method according to claim 22, wherein said semiconductor chip is a logic LSI chip.

26. The test circuit according to claim 22, wherein said semiconductor chip is a memory embedded logic LSI chip.

* * * * *